United States Patent [19]
Ichiyoshi

[11] Patent Number: 5,173,663
[45] Date of Patent: Dec. 22, 1992

[54] DEMODULATION CIRCUIT ENABLING INDEPENDENT RECOVERY OF THE CARRIER AND SAMPLING TIMING

[75] Inventor: Osamu Ichiyoshi, Tokyo, Japan
[73] Assignee: NEC Corporation, Japan
[21] Appl. No.: 782,644
[22] Filed: Oct. 25, 1991
[30] Foreign Application Priority Data
Oct. 25, 1990 [JP] Japan ................................ 2-285751
[51] Int. Cl.[5] ............................................. H03D 3/00
[52] U.S. Cl. .................................... 329/304; 329/306; 329/346
[58] Field of Search ............... 329/304, 306, 345, 346; 375/52, 55, 83, 87

[56] References Cited
U.S. PATENT DOCUMENTS

4,585,998 4/1986 Veillard .................. 329/304
5,090,027 2/1992 Ohsawa ................... 329/304

Primary Examiner—Robert J. Pascal
Attorney, Agent, or Firm—Ostrolenk, Faber, Gerb & Soffen

[57] ABSTRACT

A digital output of a quasi-coherent detection circuit is M-th power multiplied and then processed by a set of digital filters to generate signals for coherent detection and clock interpolation. The digital output of the quasi-coherent detection circuit is also fed, through a delay circuit, a coherent detection circuit which in turn processes the digital output of the quasi-coherent detection circuit, using the coherent detection signal. Timing error information indicative of the difference between phases of an interpolated clock and the interpolation signal determines the weighting factor of data interpolation channel filter which in turn interpolate and output coherent-detected data signal.

3 Claims, 11 Drawing Sheets

$z \equiv x + jy, \quad w = u + jv$
$z + w = (x+u) + j(y+v)$

FIG. 4

$z \cdot w = (xu - yv) + j(xv + yu)$

DEMODULATION CIRCUIT ENABLING INDEPENDENT RECOVERY OF THE CARRIER AND SAMPLING TIMING

FIELD OF THE INVENTION

This invention relates to a demodulation circuit which is broadly used in the field of communication, and more particularly to a demodulation circuit for a mobile satellite communication system.

BACKGROUND OF THE INVENTION

The market for mobile satellite communication systems appears promising. There are, however, serious technical problems to be solved, for example demodulation capability under low C/N conditions indispensable for overcoming fading or transmission attenuation caused by multipath or blocking.

Figure 12:
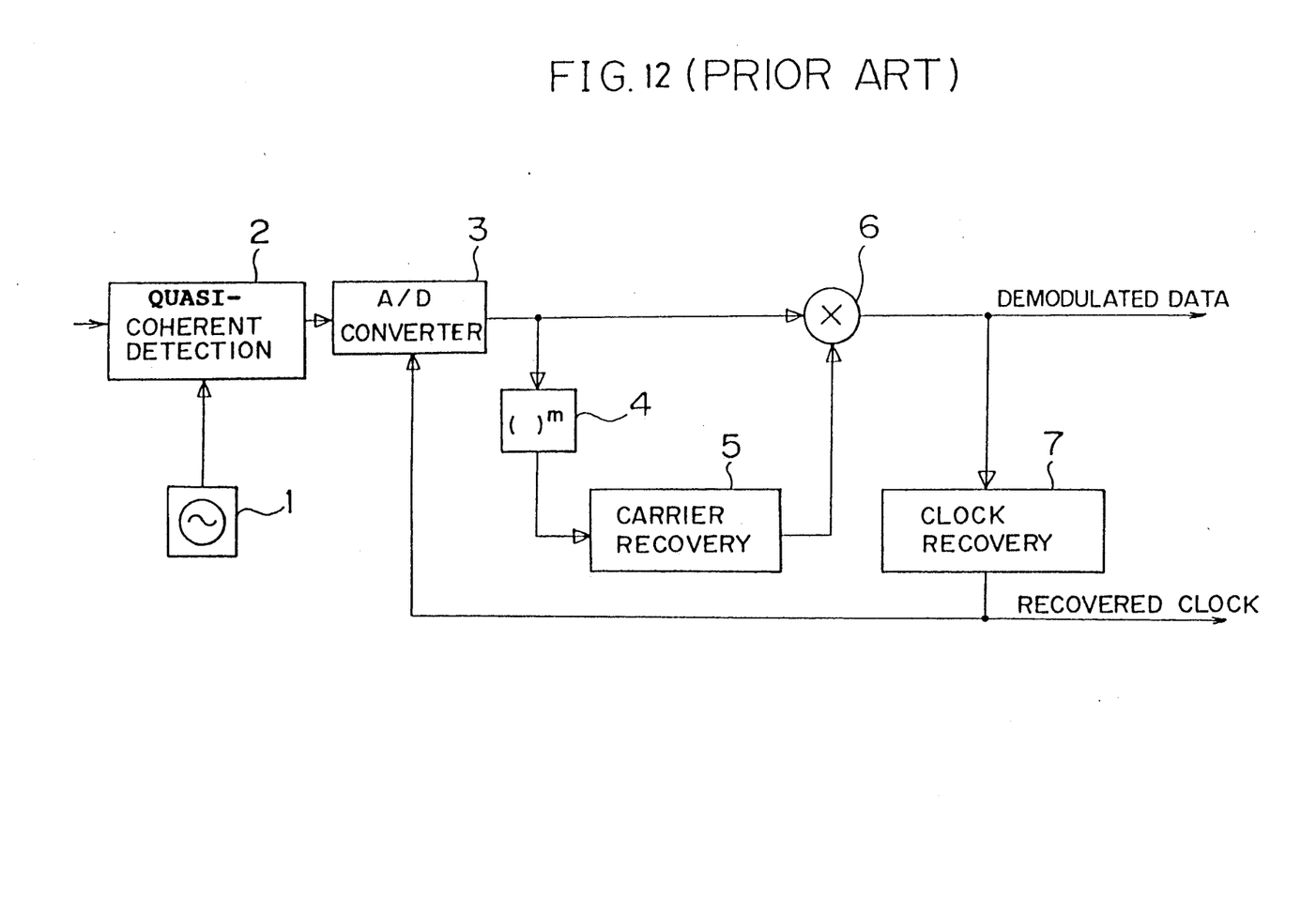
FIG. 12 shows the configuration of a conventional demodulator circuit.

Referring now to FIG. 12, which shows a conventional demodulation circuit, 1 is an oscillator which oscillates at approximately the frequency of the carrier, 2 is a quasi-coherent detection circuit, 3 is an A/D converter, 4 is a M-th power complex multiplier, 5 is a carrier recovery circuit, 6 is a complex multiplier for demodulation, 7 is a clock recovery circuit.

An inputted IF band signal which is phase-modulated in M phases is detected in the quasi-coherent detection circuit 2 and a quasi-coherent demodulated signal is outputted. The quasi-coherent demodulated signal is converted in the A/D converter 3 based on a clock signal supplied from the clock recovery circuit 7 and supplied to the M-th power complex multiplier 4 and the complex multiplier 6. The M-th power complex multiplier 4 multiplies the output of the A/D converter 4 by M and outputs it to the carrier recovery circuit 5. In the carrier recovery circuit 5, the carrier is extracted from the output which is multiplied by M in the A/D converter 3 by using a PLL or the like. The multiplier 6 coherently detects the output of the A/D converter 3 by using the carrier and outputs the demodulated data. The demodulated data is supplied to the clock recovery circuit 7 for clock recovery. The regenerated clock signal is supplied to the A/D converter 3.

Figure 13:
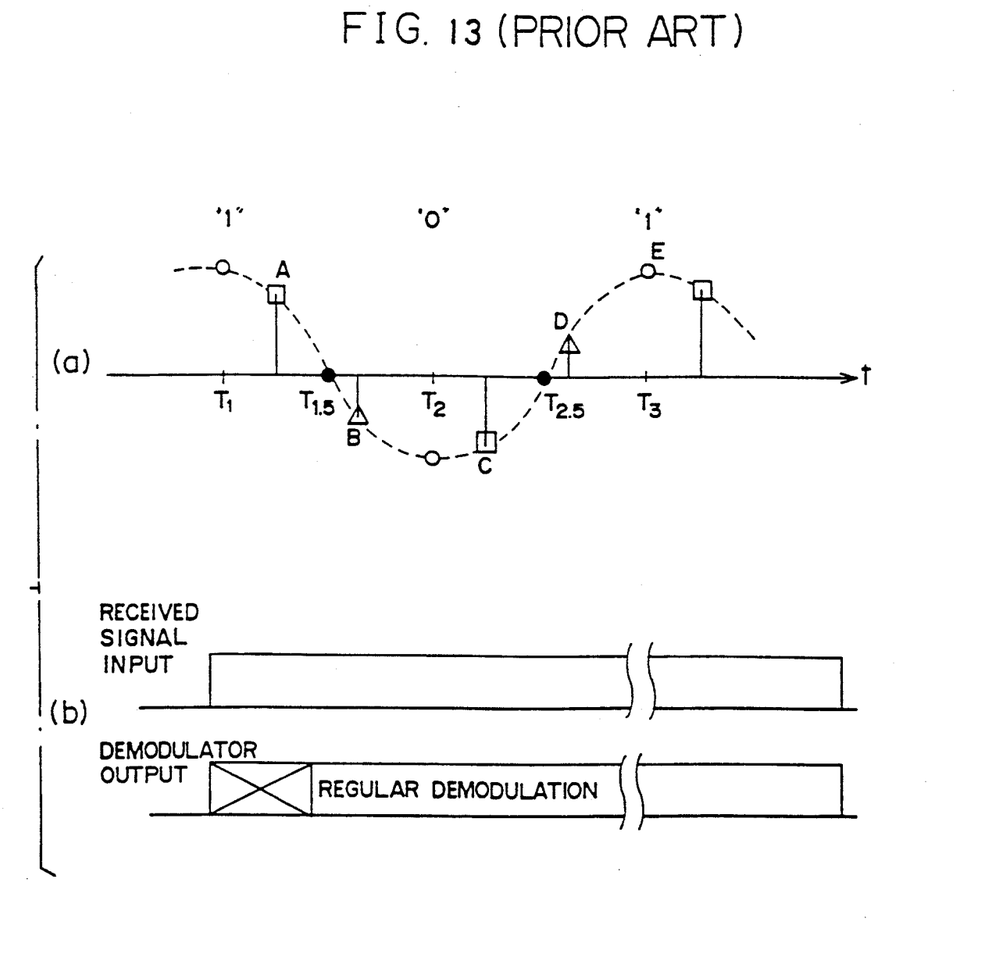
FIG. 13 shows the operation and drawbacks of the conventional demodulator circuit.

Referring to FIG. 13(a), the operation of the conventional clock recovery circuit 7 is as follows. In this figure, points illustrated with the symbols ○ denote output data obtained when the A/D converter performs sampling at correct timing and when the demodulator 6 also produces correct phase coherent detection. Points marked with the symbol ● shows zero cross points in the above condition. On the other hand, points illustrated with symbols □, △ denote those when sampling timing is shifted out of the correct position. Timing error information can be gotten from the polarities of a point B illustrated with the symbol △ and points illustrated with symbols △ before and behind that point B. A method based on using a phase locked loop (PLL or the like), and based on the timing error information, establishes synchronization of sampling timing. Carrier recovery is in turn achieved in the carrier recovery circuit 5 and coherent detecting demodulation is performed.

Incidentally, the leading portion of a received signal is lost as shown in FIG. 13(b), because the recovery of sampling timing and clocking timing consume a certain time. Also the carrier recovery and the sampling timing recovery are in very close relation, so if one does not go well, the other also does not go well, and in this case an initial operation may not be properly executed.

In FIG. 13, this can be easily understood by the fact that the clock is regenerated from the data which is coherent detected based on the carrier which is regenerated in the carrier recovery circuit 5 and the input signal of the coherent detector (4, 5, 6) is generated in the A/D converter 3 by using the clock.

Thus, the conventional method can not be used in a system wherein received signals are broken frequently by being blocked as in mobile satellite communication system.

SUMMARY OF THE INVENTION

The object of this invention is to overcome the above-mentioned defect in the conventional method, and to realize a coherent detecting demodulation circuit which enables operating the carrier recovery and sampling timing recovery independently of each other, thereby enabling a rapid burst operation.

Viewed from a first aspect, this invention provides a demodulation circuit, comprising:

quasi-coherent detection means, for receiving an IF signal which is phase-modulated in M phases and for frequency-converting said IF signal to a complex signal in a base band by using a complex local signal having a frequency approximately equal to that of a carrier of said IF signal and having sine and cosine components;

A/D converter means for receiving said complex output of said quasi-coherent detection means and for converting the same to a digital signal by sampling said complex output with sample clock timing which is externally supplied;

M-th power complex multiplier means for M-th power multiplying of said complex output of said A/D converter means;

a set of digital filtering means for receiving and filtering said output of said M-th power complex multiplier means;

complex operation means for receiving said output of said set of digital filtering means, and performing predetermined complex operation to the same to output signals for coherent detection and clock interpolation;

interpolation clock generation means, responsive to said signal for clock interpolation, for performing clock interpolation in a predetermined manner;

delay means for delaying said complex output of said A/D converter;

complex multiplier means for performing coherent detection of said output of said delay means with said signal for coherent detection;

interpolation channel filtering means for receiving an output of said complex multiplier means and performing an FIR type filtering operation for the same using weighting factors supplied externally; and weighting factor storage means for storage weighting factors for said interpolation channel filtering means, said weighting factors being determined based on timing error information indicative of a difference between an output phase of said interpolation clock generation means and a phase of said signal for clock interpolation;

whereby said interpolation channel filtering means also receives an output of said weighting factor storage means to calculate an output thereof based on the same, said output of said interpolation channel filtering means being outputted as demodulated data.

In particular, the group of digital filtering means comprises:

first digital filtering means tuned in 0 (Hz); and second and third filtering means respectively tuned to the data clock frequency $f_k$ and $-f_k$ for the modulated signal.

More over, the complex operation means comprises:

first complex multiplier means for multiplying a complex conjugate of the output of said second digital filtering means and the output of said first digital filtering means;

second complex multiplier means for multiplying a complex conjugate of an output of said third digital filtering means and said output of said first digital filtering means;

complex adding means for adding said complex conjugates each outputted from said first and second complex multiplier means to output said signal for clock interpolation; and 1/M-th power complex multiplier means for 1/M-th power multiplying said output of said first digital filter to output said signal for coherent detection.

DESCRIPTION OF THE FIGURES

FIGS. 8(1)-(2) and FIGS. 9(1)-(2) illustrate the operation of the M-th power multiplier.

DESCRIPTION OF THE EMBODIMENT OF THE INVENTION

Figure 1:
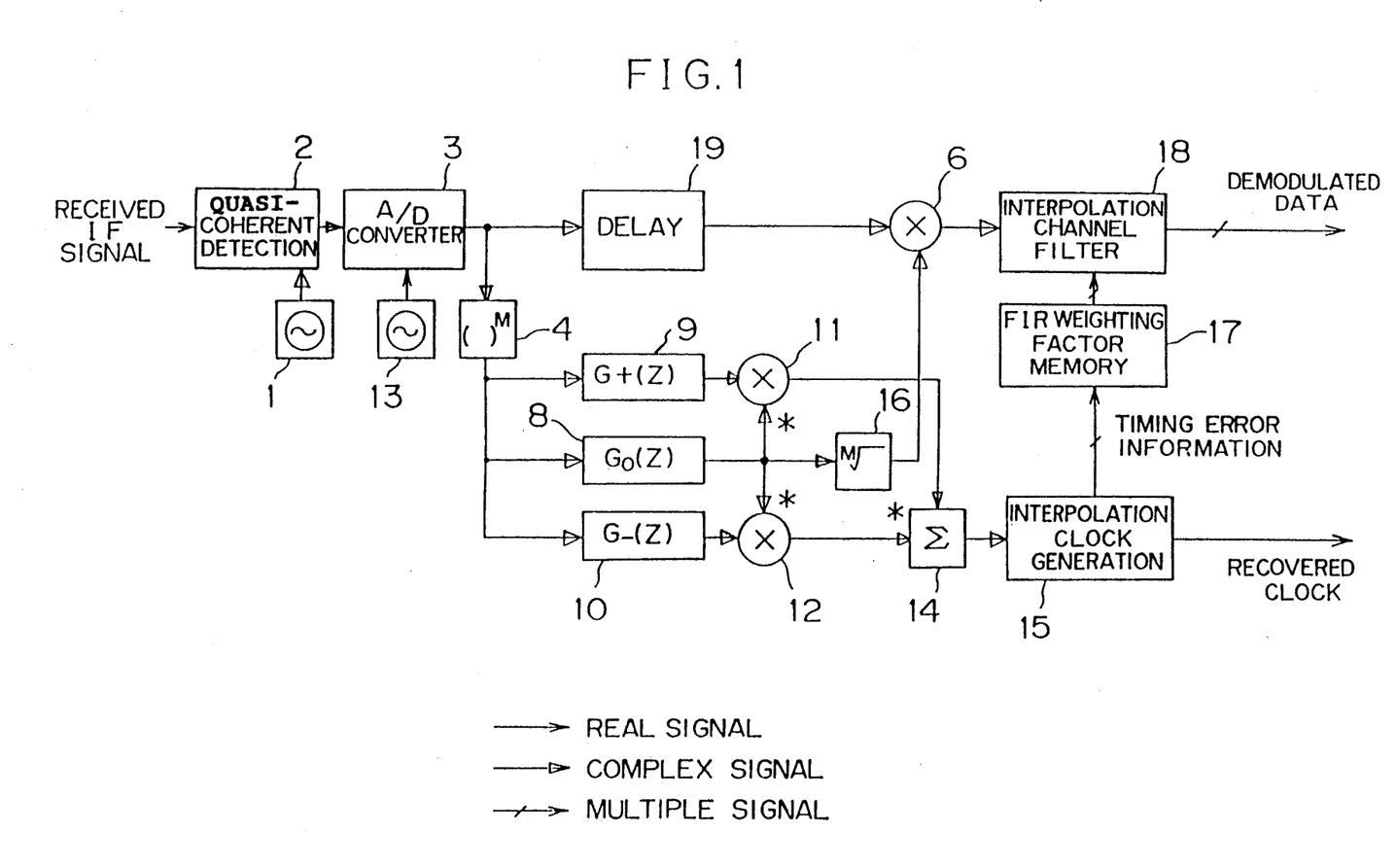
FIG. 1 illustrates the demodulator circuit of this invention.

A block diagram of the demodulator circuit according to the invention is shown in FIG. 1 wherein corresponding parts to those in FIG. 12 have the same references. In this figure, 8 is a low pass filter tuned in 0 Hz, 9 is a bandpass filter tuned to $+\omega_k$ (modulation data clock frequency $f_k$), 10 is a bandpass filter tuned to $-\omega_k$. 11 and 12 are complex multipliers, 13 is a sample clock generator supplying a sampling timing signal for the A/D converter 3. 14 is a complex multiplier, 15 is an interpolation clock generation circuit, 16 is a 1/M-th complex multiplier, 17 is a FIR weighting factor memory, 18 is an interpolation channel filter, and 19 is a delay unit.

Figure 2:
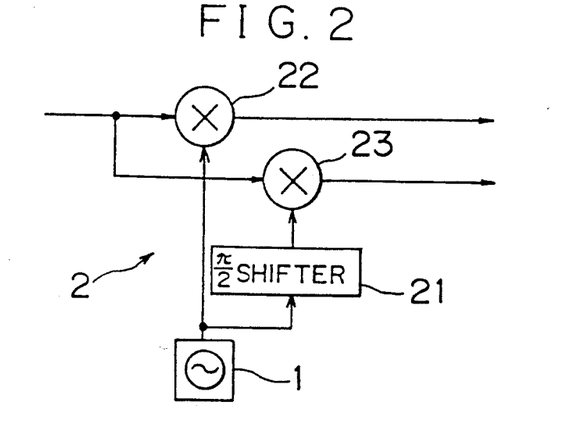
FIG. 2 illustrates a quasi-coherent detection circuit used in this invention.
Figure 3:
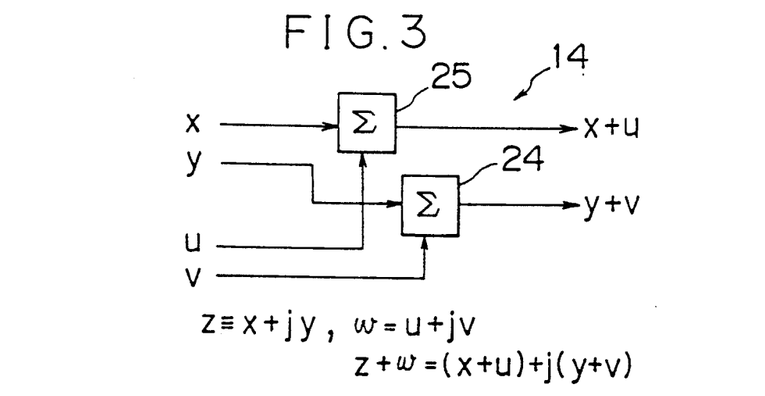
FIG. 3 shows a complex adder used in this invention.
Figure 4:
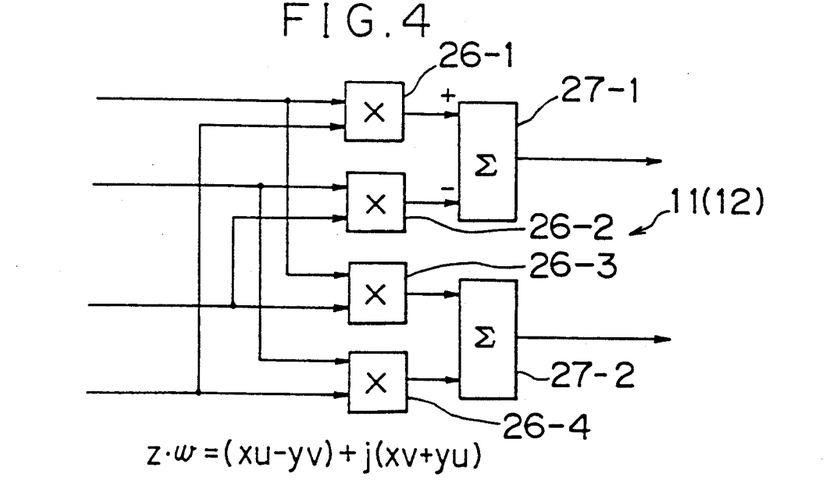
FIG. 4 shows a complex multiplier used in this invention.
Figure 5:
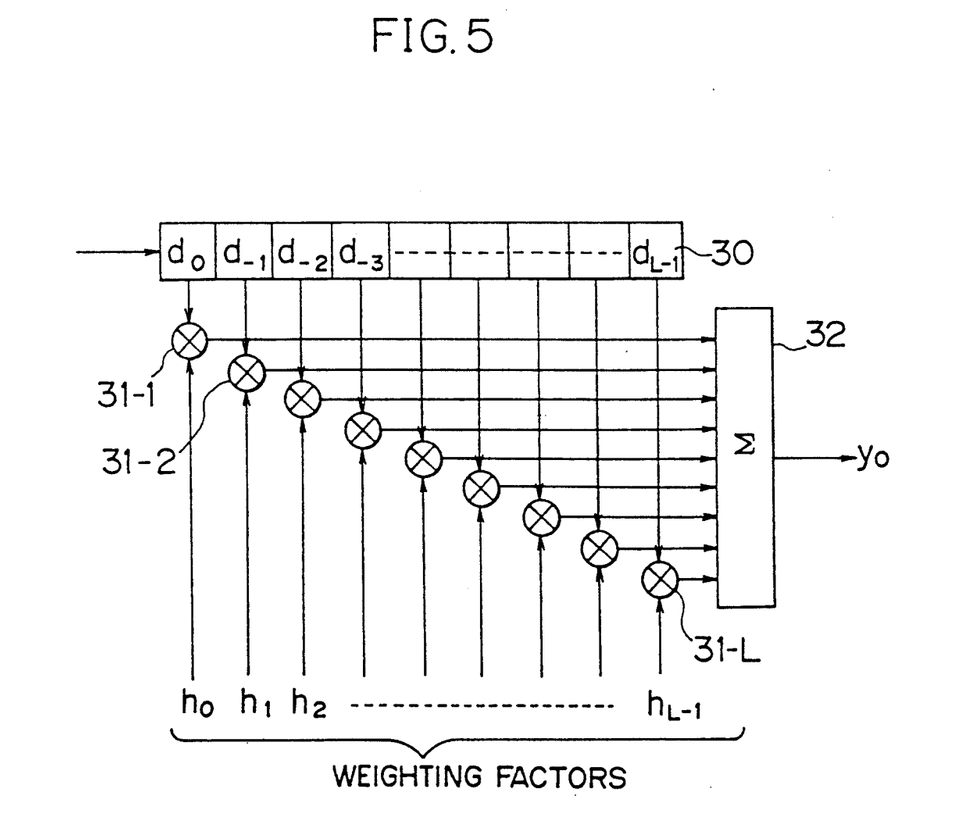
FIG. 5 shows a FIR type digital filter used in this invention.
Figure 6A:
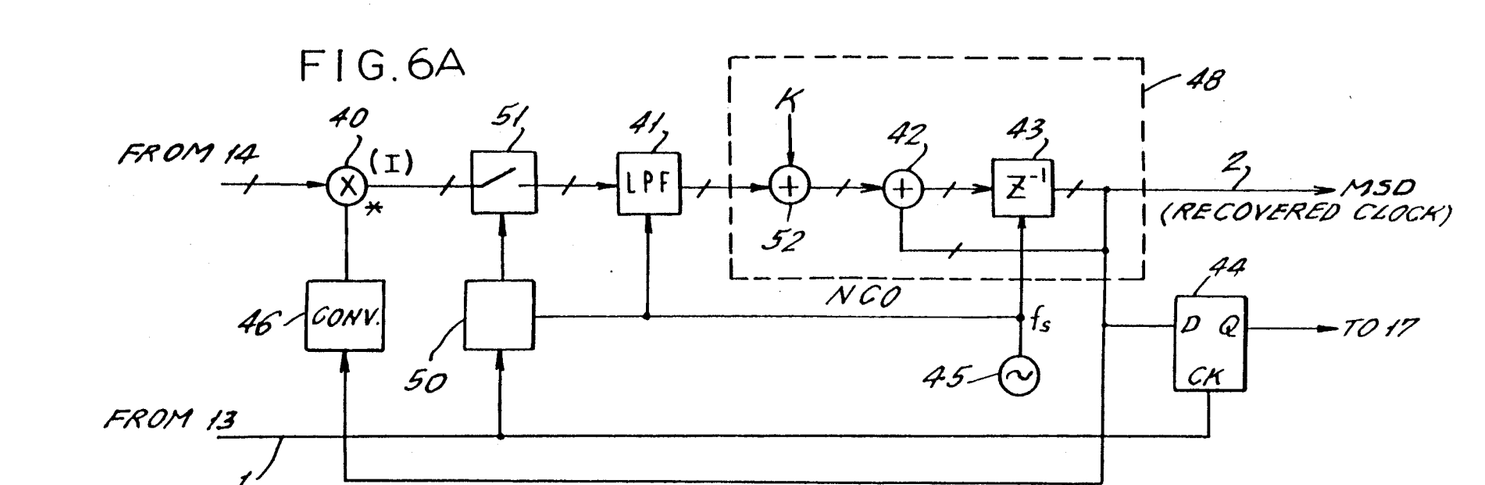
FIG. 6A illustrates an implementation of the interpolation clock generation circuit 15 in FIG. 1.

FIG. 2 to FIG. 6A show the implementation of the signal processing circuits used in this invention. FIG. 2 shows the quasi-coherent detection circuit 2 and in this figure, 21 is a $\pi/2$ phase-shifter, 22 and 23 are multipliers (mixers). FIG. 3 shows complex adders, wherein 24 and 25 are adders. FIG. 4 shows the complex multiplier 11 (12), wherein 26-1 to 26-4 are multipliers, and 27-1 and 27-2 are adders. FIG. 5 shows the configuration of the FIR digital filters 8, 9, 10, and 18, wherein 30 is a delay line with taps, 31-1 to 31-L are multipliers, and 32 is an adder. FIG. 6A shows the interpolation clock generation circuit 15, the details of which will be describer later.

Figure 7:
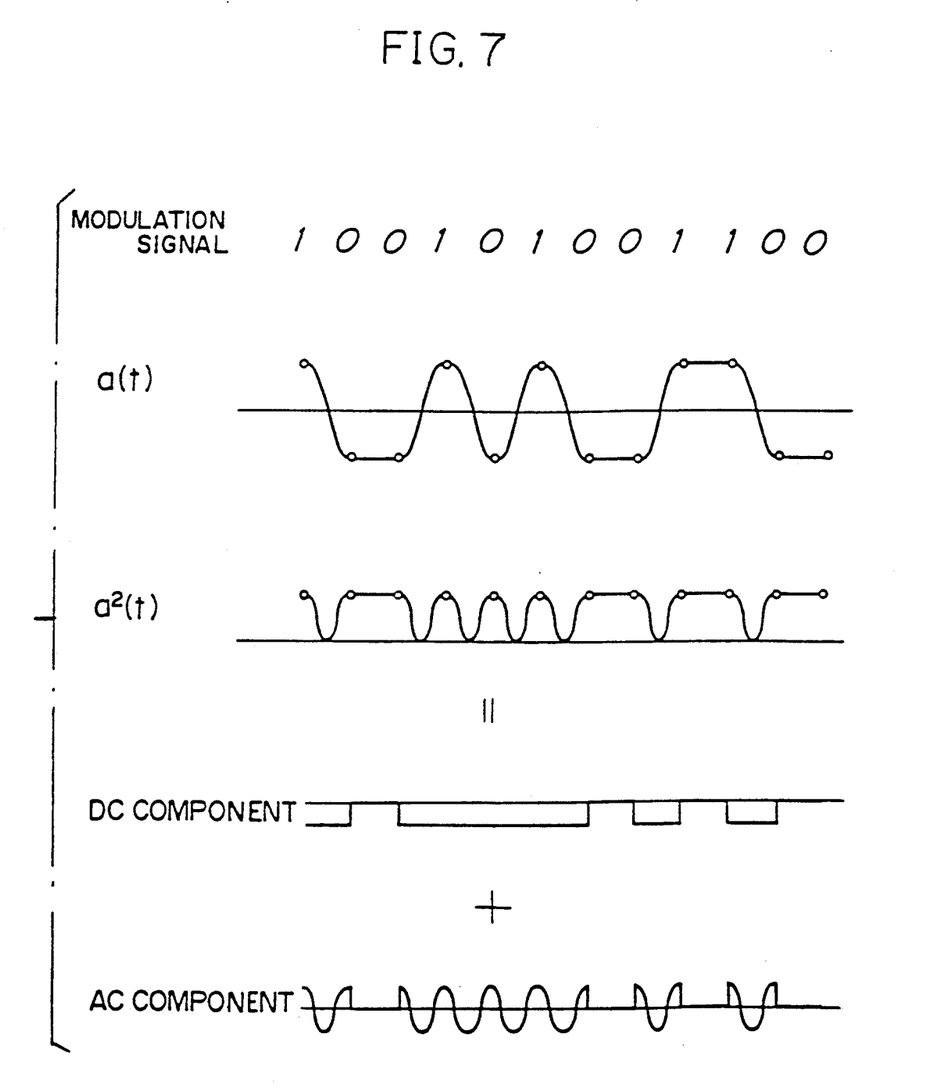
FIG. 7 illustrates signal waveform of the input and output of a M-time multiplier.
Figure 8:
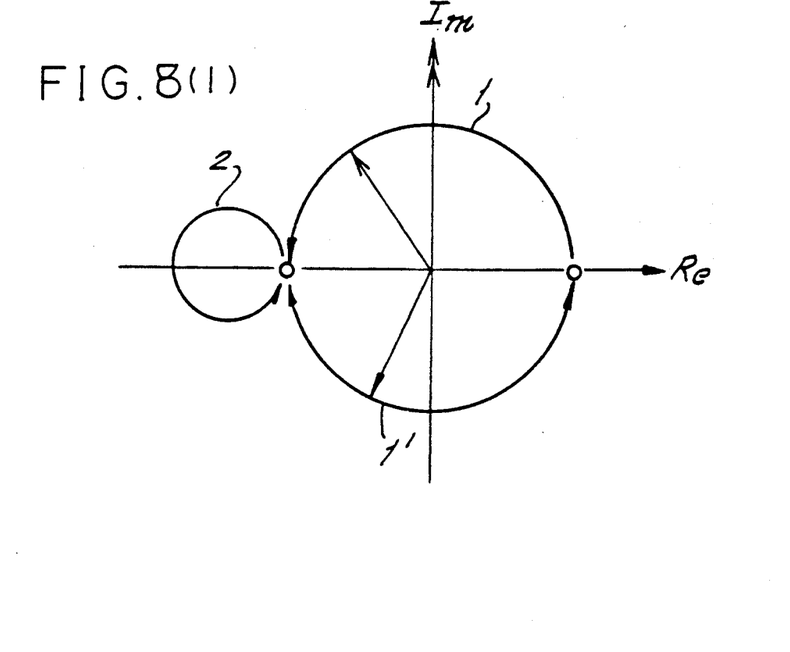
Figure 9:
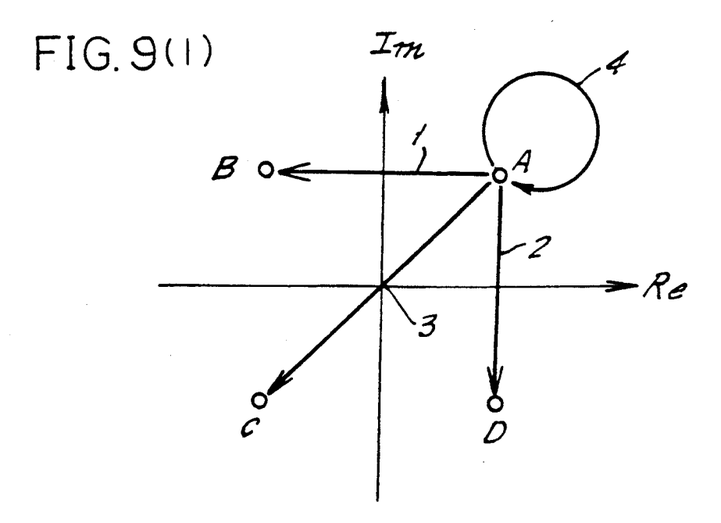

Referring now to FIG. 1, the operation of this invention is as follows. A signal detected through the quasi-coherent detection circuit 2 is separated into two signals by the A/D converter. One of these signals is inputted to the M-th power complex multiplier 4. M denotes the number of phases used in this modulation, and in the case of BPSK M=2, whereas for QPSK, OPSK, MSK or the like M=4. Carrier and clock components are derived from the signal spectrum in the output of the M-th power complex multiplier 4. Referring to FIG. 7 as well, the case where M=2 or BPSK is in particular described.

The output from the A/D converter 3

$$W(t)=a(t)e^{j(\omega t+\theta)}$$

a(t); a modulation signal $\omega t+\theta$; a phase error of the carrier is doubled (twice multiplied), and the result is $$W^2(t)=a^2(t)\cdot e^{j2(\omega t+\theta)}$$

The second factor is a sum of a frequency shift ($2\cdot\omega$) and a phase shift ($2\theta$).

The term of $a^2(t)$ includes the DC and the clock components which are shown in FIG. 7. In the case of PSK in M phases, the term of a(t) is expressed as a complex signal. The term of a(t) in FIG. 7 however shows for example the real part in a PSK signal in two phases. In this figure, $a^2(t)$ shows the second power of the real part. As shown in FIG. 7, the second power signal can be divided to a DC component and a clock component. In addition, it can be understood that a DC value which shows a carrier component appears in the part during which the term of a(t) does not vary and a clock component appears in the part during which the term of a(t) varies.

Generalizing the above explanation, the case that the term of a(t) is a complex signal is described as follows.

FIG. 8 (1) and (2) are figures to explain that a clock component and a carrier component appear in the case of BPSK.

When modulated data shifts from (1,0) to (−1,0), the term of a(t) shifts from (+1,0) to (−1,0) on the real axis in a data clock period. As shown with ① and ①′ in FIG. 8(1), this transition vector can be expressed by the sum of the vector ① which rotates from the phase 0 to the phase $\pi$ counterclockwise on the circular arc and the vector ①′ which rotates clockwise on the circular arc. Therefore, when the term of a(t) varies from (+1,0) to (−1,0), the vector which rotates from the phase 0 to the phase $2\pi$ counterclockwise and the vector which rotates from the phase 0 to the phase $-2\pi$ clockwise appear in the term of $a^2(t)$ as shown with ① and ①′ in FIG. 8(2). This means that the positive data clock frequency component ($+\omega_k$) and the negative data clock frequency component appear in the term of $a^2(t)$. These respectively correspond to the data clock frequency components which respectively appear on the upper sideband and the lower sideband.

The case that the term of a(t) varies from (−1,0) to (1,0) is similar to the above.

Where the modulated data remains in (−1,0) as shown with ② in FIG. 8(1), the term of $a^2(t)$ also remains in phase 0 as shown with ② in FIG. 8(2). In this case, the DC component appears in the term of $a^2(t)$.

Figure 10:
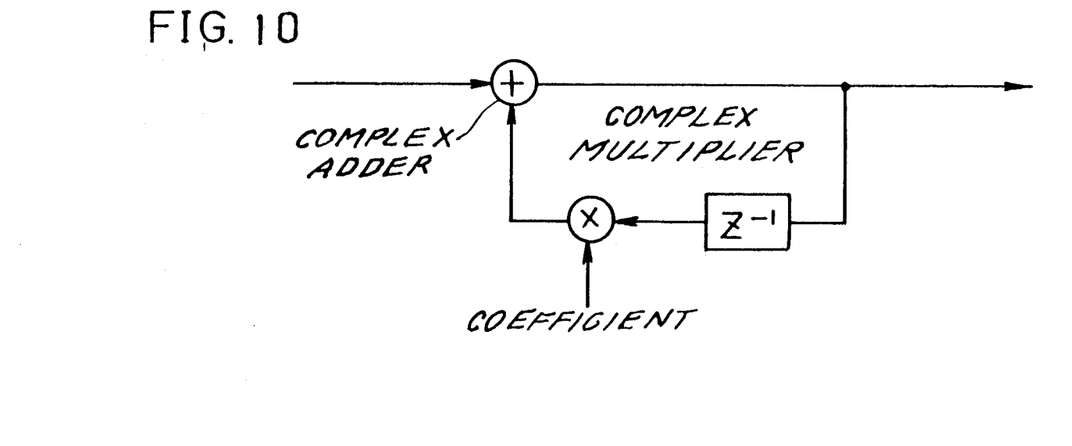
FIG. 10 shows an implementation of the filters 9 and 10 in FIG. 1.
Figure 11:
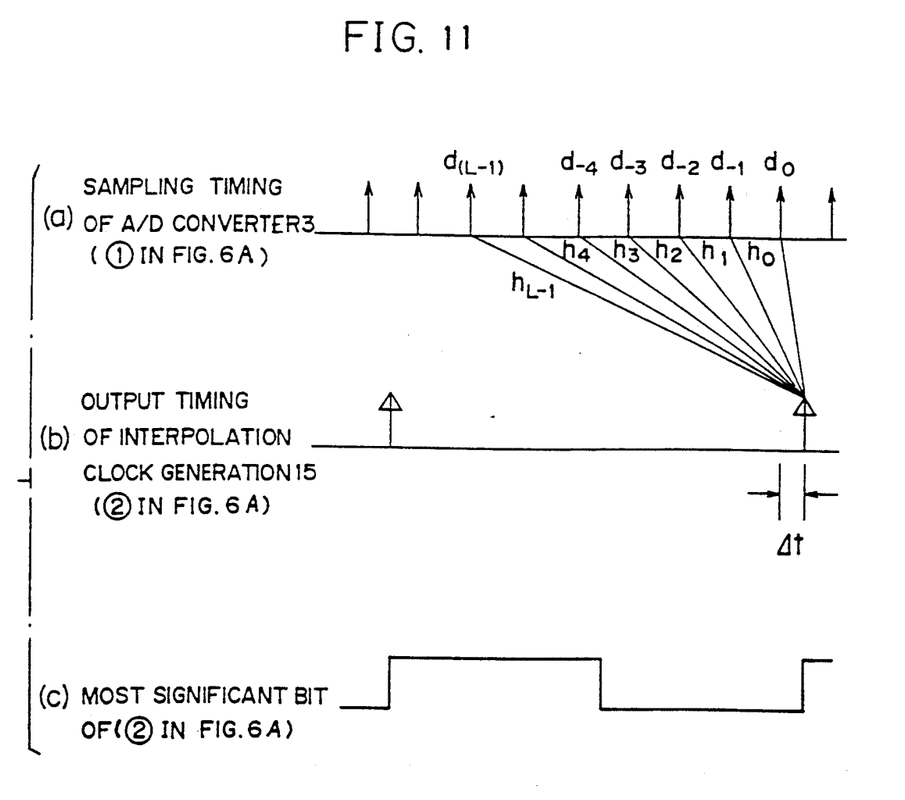
FIG. 11 illustrates interpolation of the demodulated data in accordance with this invention.

FIG. 9(1) shows the disposition of a signal point of a QPSK signal (M=4), FIG. 10(2) shows a QPSK signal $a^4(t)$ which is multiplied by four.

Firstly, in the case that a signal point remains at the point A (or B, C, D), a DC component appears in the term of $a^4(t)$ similarly to the case of BPSK. Next, in the case of transition from the signal point A to the signal point B within one clock period, the term of $a^4(t)$ rotates counterclockwise from the phase $\pi$ to the phase $\pi$ (as shown with ⑦ in FIG. 9(2)). This means that when the term of a(t) shifts from the signal point A to the signal point B within 1 clock period, the positive data clock frequency component ($+\omega_k$) appears in the term of $a^4(t)$.

Similarly to the above, when the term of a(t) shifts from the signal point A to the signal point D the vector of the term of $a^4(t)$ rotates clockwise from the phase $\pi$ to the phase $-\pi$ in one clock period (as shown with ⑥ in FIG. 9(2)). It is also understood that the negative clock frequency component ($-\omega_k$) appears in $a^2(t)$.

Further, the case of shifting from the signal point A to the signal point C is regarded as a synthesis of the transition A→B→C and transition A→D→C. In this case, the vector $a^2(t)$ can be expressed with the vector which rotates by $4\pi$ counterclockwise from the phase $\pi$ to the phase $\pi$ in one clock and the vector which rotates by $4\pi$ clockwise from the phase $\pi$ to the phase $\pi$ in one clock. This means the appearance of the component $+2\omega_k$ and the component $-2\omega_k$ in this case.

The above description given for the case of BPSK and QPSK is also applied to the case of $\pi/2$ off-set QPSK. Also the case of PSK in more than 4 phases is the same.

According to the above discussion, in the case of a PSK signal in M phases, the term of $a^M(t)$ is $$a^M(t) = d + \frac{b}{2} e^{-j\omega kt} + \frac{b}{2} e^{+j\omega kt} + m(t).$$

Here, the term of m(t) expresses together a residual modulated wave component and a noise component which comprise the frequency component of $|f| \geq \omega_k$.

And then, the output $W^M(t)$ of the M-th power multiplier 4 is expressed in the following.

$$W^M(t) = a^M(t) \cdot e^{j2(\omega_e t + \theta_e)}$$
$$= \left\{ \frac{b}{2} e^{-j\omega kt} + \frac{b}{2} e^{+j\omega kt} + d + m(t) \right\} \cdot e^{jM(\omega_e t + \theta_e)}$$

The term of $a^2(t)$ which is the output of the M-th power multiplier 4 is supplied to the filters 8, 9, 10 which respectively tune at the frequency $0, +\omega_k, -\omega_k$.

Generally, since $\omega \approx 0$, the output of the filter 8, $g_8$ is, $$g_8 = d \cdot e^{+jM(\omega_e t + \theta_e)}.$$

The output of the filter 9, $g_8$ is $$g_9 = \frac{b}{2} e^{+j\omega kt} \cdot e^{+jM(\omega_e t + \theta_e)}$$

The output of the filter 10, $g_{10}$ is $$g_{10} = \frac{b}{2} e^{-j\omega kt} \cdot e^{+jM(\omega_e t + \theta_e)}$$

The output of the filter 8, $g_8$ is supplied to the 1/M-th power complex multiplier 16, becomes $$M\sqrt{d} \cdot e^{j(\omega_e t + \theta)}$$

and is supplied to the complex multiplier 6. Then, the coherent detection is performed with the output of the delay unit 19. Here, the amount of the delay of the delay unit 19 is equal to the time which is needed for processing in the M-th power complex multiplier 4, the filter 8 and the 1/M-th complex multiplier.

Also an operation of $g_{11} = g_9 \cdot g_8^*$ is done in the complex multiplier 11 and one of $g_{12} = g_8 \cdot g_{10}^*$ is done in the complex multiplier 12. (* means a complex conjugate).

In the complex adder 14, an operation of $g_{12}^* + g_{11}$ is done. Then, the output of $g_{14}$ of the complex adder 14 is $$g_{14} = (g_8^* g_9)^* + (g_8^* g_{10})$$
$$= bd \, e^{+j\omega kt}.$$

Thus, the signal which indicates the phase of the clock is obtained.

Further more, the configuration as shown in FIG. 10 can be used for the filters 9 and 10. In FIG. 10, the coefficient for the filter 9 is $\alpha e^{j\omega kT}$ and the coefficient for the filter 10 is $\alpha e^{-j\omega kT}$. For example, when the coefficient is $\alpha e^{-j\omega kT}$, the transfer function of the circuit as shown in FIG. 10 is $1/(1 - \alpha e^{-j\omega kT} z^{-1})$.

By substituting the term of $e^{j\omega t}$ to the term of Z, it is clear that this transfer function is equal to a transfer function of a single resonance circuit with resonance frequency $\omega = +\omega_k$. Also, in the case that the coefficient is $\alpha e^{j\omega kT}$, the circuit in FIG. 10 is a single resonance circuit with the resonance frequency $\omega = -\omega_k$.

Next, the method of signal interpolation is described.

An interpolation is a process which calculates the data values at any specified time based on a series of data which are sampled at a predetermined time interval, and its simplest form is to let the data values pass through an analog type filter. In this case, the output signal is a continuous signal.

According to this invention, the interpolation is processed by digital signal processing. Therefore, at first, the clock of the demodulated signal must be recovered at a sufficiently minute (highly resolved) time interval. Such a process is performed in the interpolation clock generation circuit 15 and a configuration of the circuit is shown in FIG. 6A. In this figure, 40 is a complex multiplier, 41 is a low pass filter, 42 and 52 are adders, 43 is a delay unit and for one sample, 44 is a latch unit, 45 is an interpolation clock generation circuit clock source. Further, 46 is a phase/complex-signal converting circuit, 48 is a numerically controlled oscillator (NCO), 50 is a sampling impulse generation circuit, and 51 is a sampler.

Figure 6B:
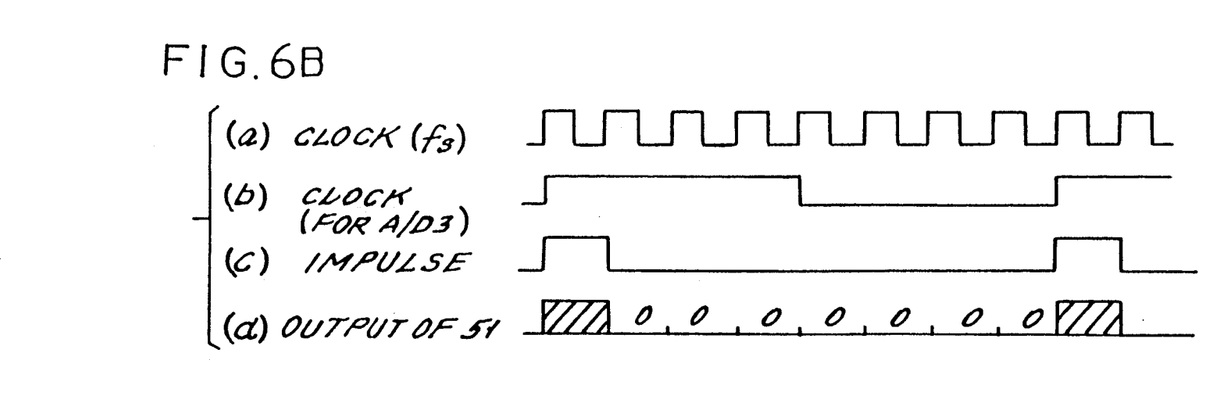
FIG. 6B illustrates a timing chart showing the operation of the interpolation clock generation circuit 15 in FIG. 6A.

Further referring to FIG. 6A, a complex signal X(t) the phase of which indicates the phase of the data clock is supplied to one input of the complex multiplier 40 from the complex adder 14 in FIG. 1. The complex signal Y(t) the phase angle of which indicates the phase of the recovered clock is inputted into another input of the complex multiplier 40 from the complex signal converting circuit 46. The complex multiplier 40 calculates the operation of {X(t)*(t){ (* is a complex conjugate), outputs only the imaginary part $I_m${X(t)Y*(t){ and supplies it to the sampler 51. The sampler 51 samples the output of the complex multiplier 40 by using the impulse clock which is supplied from the sampling impulse generation circuit 50 the detail of which is described later. The sampler 51 then outputs the output of the complex multiplier 41 only at the timing of the leading portion of the sampling clock for the A/D converter 3 in FIG. 1, outputs the value 0 at the other timing, and supplies them to the low pass filter 41. This process is shown by the timing chart in FIG. 6B wherein in the chart (a) shows the sampling clock of the interpolation clock generation circuit clock source 45, the frequency of which is eight times higher (eight times in the case of FIG. 6B) than the clock for the A/D converter 3 (FIG. 1) shown in the chart (b). FIG. 6B(c) shows the sampling pulse which is generated based on the clock for the interpolation clock generation circuit and the clock for the A/D converter 3. FIG. 6B(d) shows the output of the sampler 51. The sampler outputs the output of the complex multiplier 40 only at the time when the sampling pulse is at a high level and outputs the value of zero at the other timing. The output of the sampler 51 is smoothed in the digital low pass filter (LPF) 41 and supplied to the numerically controlled oscillator (NCO) 48. The NCO 48 consists of the adder 52 which adds a constant K to the output of the LPF 41, the adder 42 which adds the output of the adder 42 and the output of the delay circuit 43, and the delay unit 43 which delays the output of the adder 42 by $1/f_s$ sec. Here, the constant K is set to oscillate NCO 48 at the frequency $f_k$ ($=\omega_k/2\pi$) or the data clock frequency when the output of the LPF 41 is 0. At this time, the output of the LPF 41 controls this oscillation phase. In addition, the output of NCO 48 is a phase signal which shows the phase of recovered clock, as well known. The MSB of the output of the NCO 48 is outputted as a recovered clock.

Further, the output of the NCO 48, that is the phase signal is supplied to the phase/complex-signal converting circuit 46, converted to a complex signal the phase angle of which indicates the phase of the recovered clock.

Thus, the recovered clock (FIG. 6A②) is generated by using the signal which indicates the phase of the recovered clock inputted from the complex adder 14 in FIG. 1 at every timing of $1/f_{AD}$ ($f_{AD}$: the clock frequency for the A/D converter 3).

Also, the phase signal which is the output of the NCO 48 is sampled in D-type flip-flop 44 at a rising edge of the clock for the A/D converter 3 which is supplied from the oscillator 13 in FIG. 1. The sampled value is a signal which shows the phase of the recovered clock at the rising edge of the clock for the A/D converter 3 in FIG. 1, which is supplied to the FIR weighting coefficient memory 17.

Figure 6C:
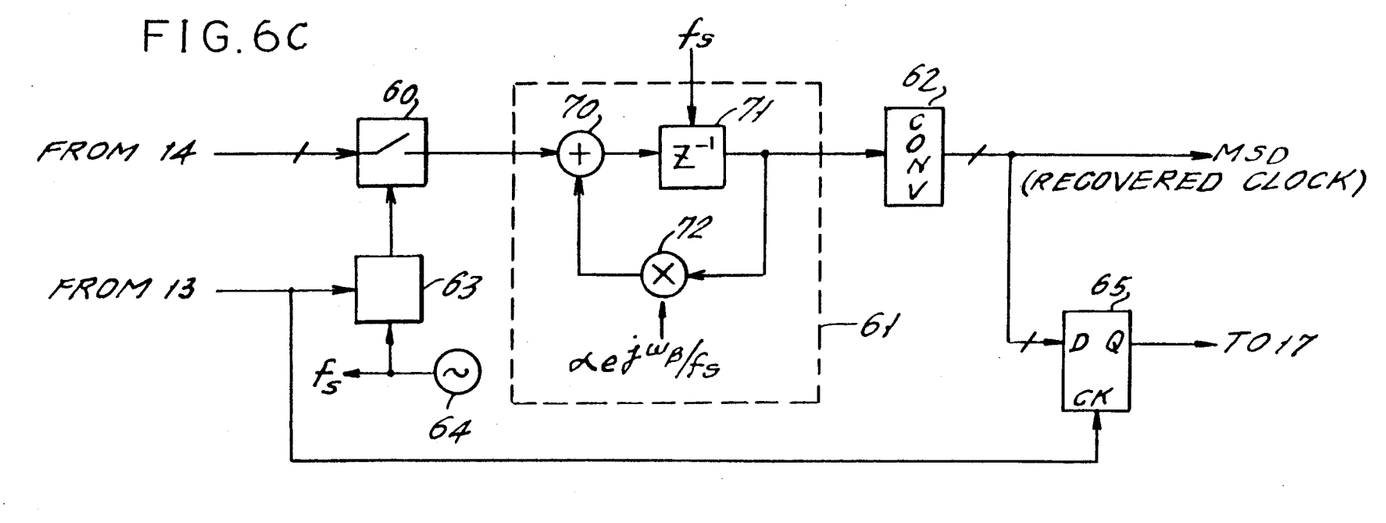
FIG. 6C illustrates an alternative implementation of the interpolation clock generation circuit in FIG. 1.

FIG. 6C shows a second implementation of the interpolation clock generation circuit 15. This second implementation of the interpolation clock generation circuit 15 consists of a sampler 60, a complex digital tank circuit 61, a complex/phase-signal converter 62, a sampling impulse generation circuit 63, an interpolation clock generation clock source 64 for a D-type flip-flop circuit 65.

The operations of the sampler 60, the sampling impulse generation circuit 63 and the interpolation clock generation clock source 64 in FIG. 6C is similar to those of the sampler 50, the sampling pulse generation circuit 50 and the interpolation clock generation clock source 45 in FIG. 6A except for the operation of the sampler 60, to which the output of the complex adder 14 is supplied.

The sampler 60 samples the complex signal supplied from the complex adder 14 in FIG. 1, the phase angle of which indicates the phase of the clock component of the received signal, stuffs zeroes and supplies the resultant signal to the complex digital tank circuit 61.

The configuration of that complex digital tank circuit 61 is similar to the digital tank circuit shown in FIG. 10 except that the amount of delay of the delay circuit 71 is $1/f_s$ and the coefficient given to the complex multiplier 72 is $\beta e^{j\omega k/f_s}$ ($\beta$ is a constant). That complex digital tank circuit 61 operates as a single tuning circuit the operational rate of which is $f_s$, the tuning frequency of which is $\omega_k$. And it inserts at the rate $f_{AD}$ the output of the complex adder in FIG. 1 to the complex signal of the rate $f_s$ and output it. Needless to say, the phase angle of the inserted complex signal shows the phase of the clock component in the received signal. This inserted complex signal is converted to the signal which shows the phase angle that is the phase of the recovered carrier in the complex-signal/phase conversion circuit 62. The MSD of the phase angle signal is outputted as the recovered clock. The D-type flip-flop 65 outputs the signal indicative of the phase of the recovered clock at a rising edge of the clock for the A/D converter 3 in FIG. 1 to the FIR weighting coefficient memory 17 likewise D-type flip-flop 44 in FIG. 6A.

It should be noted that the interpolation clock generation circuit in FIG. 6C has the merit that the pull-in time is extremely short, since it has a feedforward configuration. On the other hand, the pull-in time of the circuit in FIG. 6A is relatively long, since its configuration is of a feedback loop type which includes filters. This point is a merit of the circuit in FIG. 6C superior to the one in FIG. 6A.

Next, the operation of the interpolation is described.

FIG. 10 shows the relation of the input timing ① and the output timing ② in FIG. 6A. For interpolation purposes, the output at the timing in FIG. 10(b) is at first calculated from the input signal at the timing shown in FIG. 10(a). For this purpose, a series of the input signals are weighting-added as shown in FIG. 10. The filter configuration for the interpolation is shown in FIG. 5. The output value in FIG. 5 is $$d_0 = h_0 d_0 + h_1 d_{-1} \ldots + h_{L-1} d_{-(L-1)}$$
$$= \sum_{L=0}^{L-1} h_1 d_{-(L-1)}.$$

As shown in FIG. 10, the above coefficients $h_0, h_1, \ldots h_{L-1}$ are determined by a timing error $\Delta t$, and the timing error information is given at the output of the latch unit 44 of FIG. 6A. In particular, the above weighting coefficients are stored in the FIR weighting coefficient memory in FIG. 1, which are determined using the timing error information supplied from the interpolation clock generation circuit 15, and thus outputted. By using the weighting coefficients which are thus obtained, the product and the sum shown in FIG. 5 are calculated. And then the output synchronized in the regenerated clock of the modulation signal is obtained. The output as well as the clock are outputted as the demodulation data and the clock in FIG. 1.

As the above description has made clear, the recovery of the carrier and modulation clock in the demodulation circuit according to this invention does not involve any feed-back circuit, and therefore the demodulation circuit has a complete feedforward configuration. This circuit consists of only simple filters, and results in a reliable demodulation operation at initial timing and resynchronization timing.

In conclusion this invention results in the following benefits.

(1) It results in a demodulator circuit which operates rapidly even at initial timing and re-operation, since it enables to operate a sampling of an A/D converter asynchronous to clock timing carried out by modulation signal.

(2) It enables a rapid operation, since modulation clock and carrier recoveries are simple filtering operations and it does not have a problem of pulling in caused by a character of PPL which is used in a conventional system.

(3) According to the above, the demodulator circuit according to this invention is effective in the field of mobile satellite communication system where received signals are frequently broken by blocking.

While the invention has been particularly shown and described with reference to a preferred embodiment, it will be understood by those skilled in the art that various changes in form and detail may be made without departing from the spirit and scope of the invention.

What is claimed is:

1. A demodulator circuit, comprising:
   quasi-coherent detection means, for receiving an IF signal which is phase-modulated in M phases and for frequency-converting said IF signal to a complex signal in a base band by using a complex local signal having a frequency approximately equal to that of a carrier of said IF signal and having sine and cosine components;
   A/D converter means for receiving said complex output of said quasi-coherent detection means and for converting the same to a digital signal by sampling said complex output with an externally supplied sample clock timing;
   M-th power complex multiplier means for M-th power multiplying said digital signal of said A/D converter means and for producing an output representative thereof;
   a set of digital filtering means for receiving and filtering said output of said M-th power complex multiplier means and for producing an output representative thereof;
   complex operation means for receiving said output of said set of digital filtering means, and for performing a predetermined complex operation thereon to output signals for coherent detection and clock interpolation;
   interpolation clock generation means, responsive to said signals for clock interpolation, for performing clock interpolation in a predetermined manner;
   delay means for delaying said digital signal of said A/D converter and for providing an output representative thereof;
   complex multiplier means for performing coherent detection of said output of said delay means with said signal for coherent detection;
   interpolation channel filtering means for receiving an output of said complex multiplier means and performing an FIR type filtering operation thereon using externally supplied weighting factors;
   and weighting factor storage means for storing weighting factors for said interpolation channel filtering means, said weighting factors being determined based on timing error information indicative of a difference between an output phase of said interpolation clock generation means and a phase of said signal for clock interpolation;
   said interpolation channel filtering means receiving an output of said weighting factor storage means to calculate an output thereof based on the same, said output of said interpolation channel filtering means being outputted as demodulated data.

2. A demodulator circuit as set forth in claim 1, wherein said set of digital filtering means comprises:
   first digital filter means tuned in 0 (Hz); and
   second and third filter means respectively tuned to the data clock frequency $f_k$ and $-f_k$ for the modulated signal.

3. A demodulator circuit as set forth in claim 2, wherein said complex operation means comprises:
   first complex multiplier means for multiplying a complex conjugate of an output of said first digital filtering means with an output of said second digital filtering means;
   second complex multiplier means for multiplying a complex conjugate of the output of said first digital filtering means and said output of said third digital filtering means;
   complex adding means for adding the output of said first complex multiplier means and the conjugate of said second complex multiplier output and outputting said signal for clock interpolation; and
   1/M-th power complex multiplier means for 1/M-th power multiplying said output of said first digital filter to output said signal for coherent detection.

* * * * *